United States Patent [19]
Narusawa

[11] Patent Number: 6,081,055
[45] Date of Patent: Jun. 27, 2000

[54] VIBRATION MOTOR

[75] Inventor: Kazuto Narusawa, Nagano-ken, Japan

[73] Assignees: Sanyo Seimitsu Corporation, Nagano-ken; Sanyo Electric Co., Ltd., Oosaka-fu, both of Japan

[21] Appl. No.: 09/251,407

[22] Filed: Feb. 17, 1999

[30] Foreign Application Priority Data

Feb. 19, 1998 [JP] Japan .................................. 10-036515

[51] Int. Cl.$^7$ ...................................................... H02K 7/06
[52] U.S. Cl. .............................. 310/81; 310/89; 310/91; 310/40 MM; 310/71; 74/87; 340/407.1; 340/311.1
[58] Field of Search .................................. 310/81, 89, 91, 310/40 MM, 71; 74/87; 340/407.1, 311.1

[56] References Cited

U.S. PATENT DOCUMENTS

| | | | |
|---|---|---|---|
| 5,373,207 | 12/1994 | Yamayuchi et al. ........................ | 310/81 |
| 5,801,466 | 9/1998 | Odagiri et al. .............................. | 310/81 |
| 5,889,349 | 3/1999 | Yasuda ..................................... | 310/261 |
| 5,952,745 | 9/1999 | Yasuda ..................................... | 310/40 |

*Primary Examiner*—Nestor Ramirez
*Assistant Examiner*—Thanh Lam
*Attorney, Agent, or Firm*—Armstrong, Westerman, Hattori, McLeland & Naughton

[57] ABSTRACT

A vibration motor (10) having a metal holder frame (30) provided with a motor accommodation portion (31) for receiving and holding a substantially tubular drum portion of a vibration motor body (20) and terminal pieces (40) for being affixed and connected to end portions of the vibration motor body. The metal holder frame has a bottom plate portion (32) adapted for soldering to a pattern on a printed circuit board. The bottom plate has a bulge portion formed by making a depression in the rear side of the bulge portion to make a projection on the front side of the bulge portion at least one position of the bottom plate portion, whereby when driving the vibration motor, the portion of the bulge portion acts as a turn-stopping device and prevents rotational deviation so that the vibration motor can be simultaneously mounted in a double-side mounting process by reflow soldering to a printed circuit board.

9 Claims, 7 Drawing Sheets

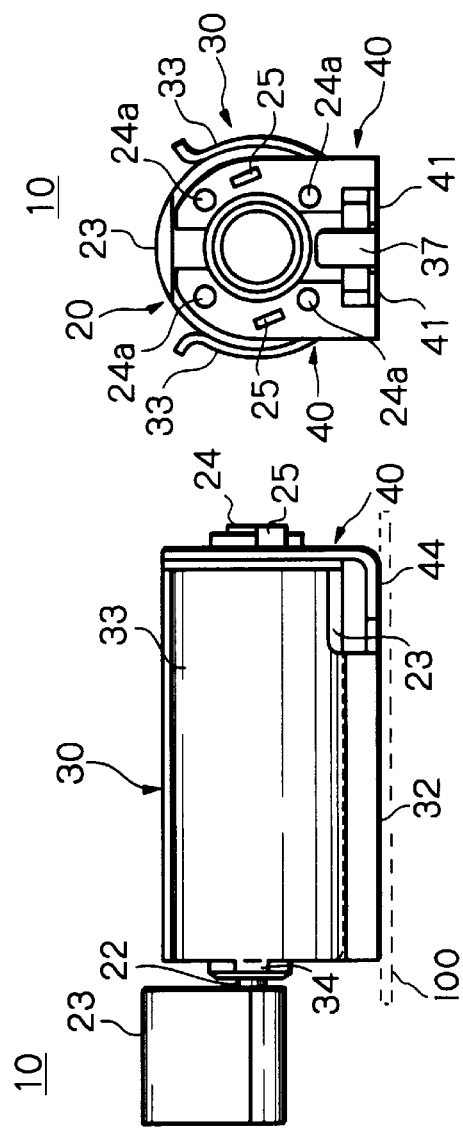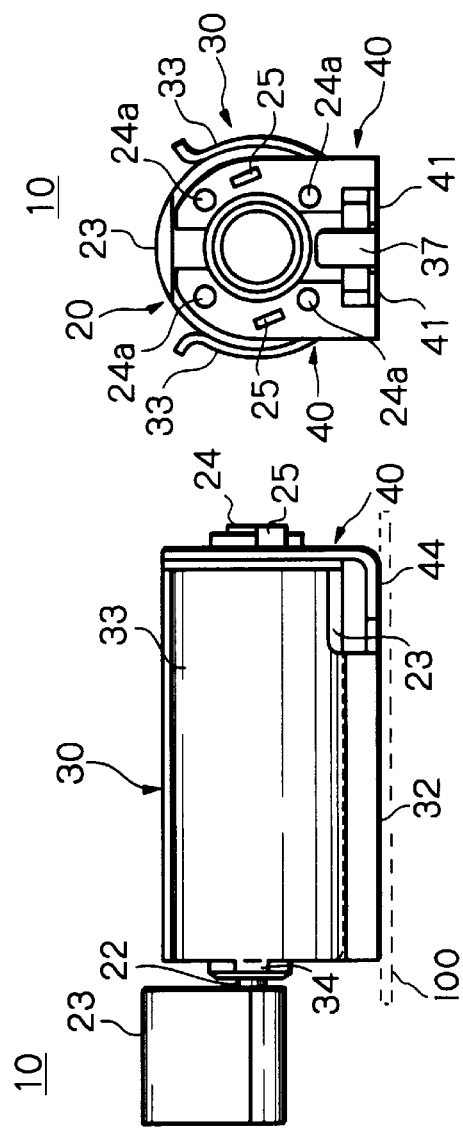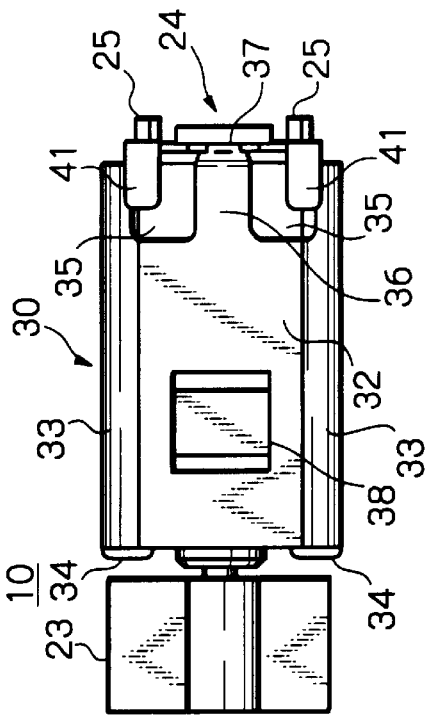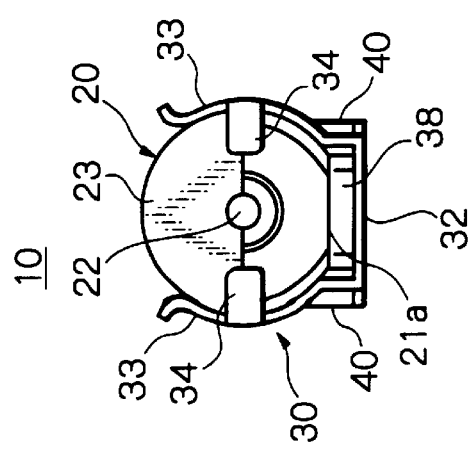

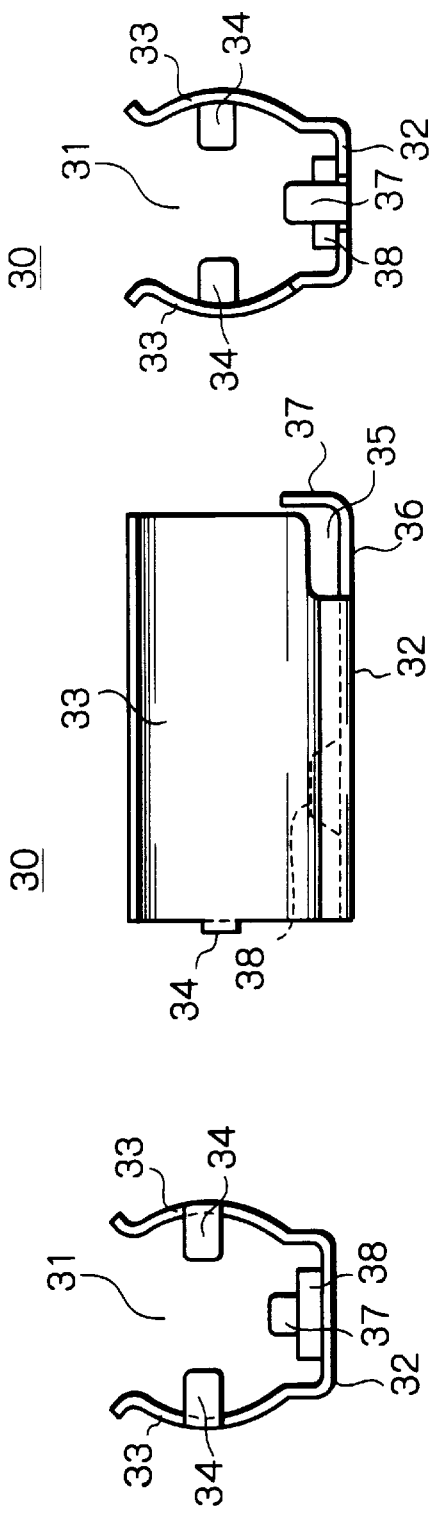

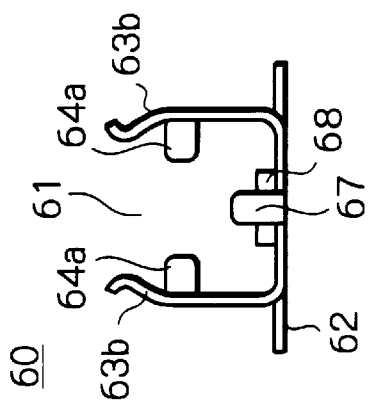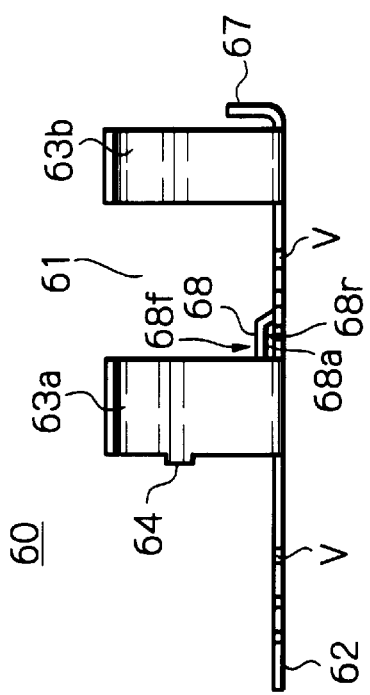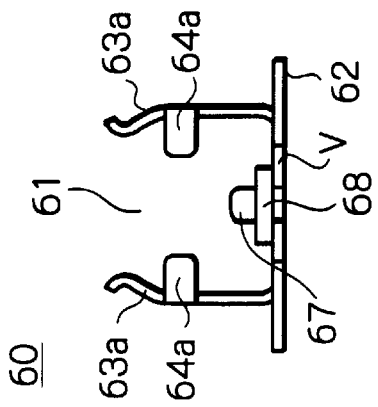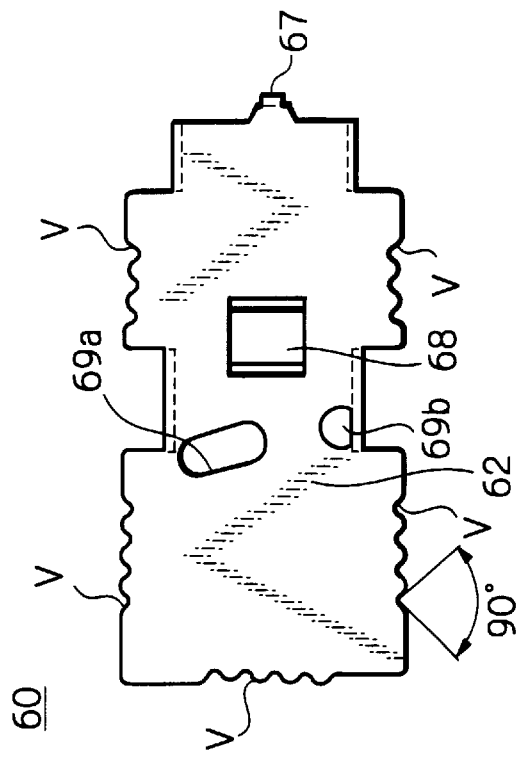

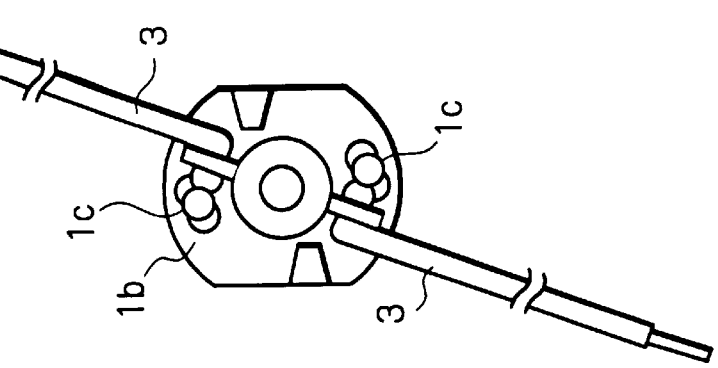
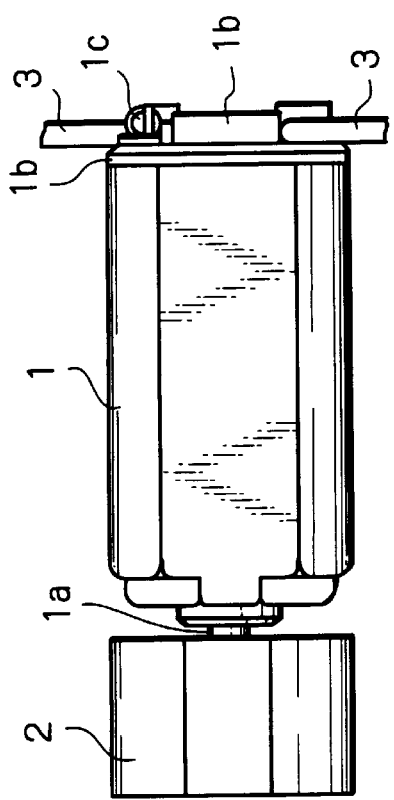
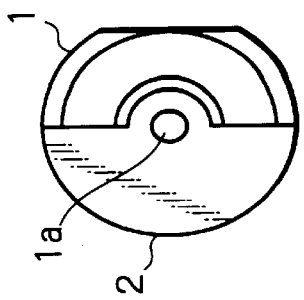
Fig. 6A PRIOR ART
Fig. 6B PRIOR ART
Fig. 6C PRIOR ART

VIBRATION MOTOR

BACKGROUND OF THE INVENTION

1. Field of the Invention

The present invention relates to a vibration motor for transmitting call information, etc. by sensible vibration built into a pager, wristwatch, portable telephone, etc. More particularly, the invention relates to a vibration motor of a structure suited for mounting on the surface of a printed circuit board.

2. Description of the Related Art

In the past, the vibration motors used for portable telephones and other telecommunications apparatuses have, for example, as shown in FIGS. 6A–6C, been comprised of a substantially tubular vibration motor body 1, a substantially half moon-like conical eccentric ring 2 tightly fixed to a motor shaft 1a projected from one end of the body 1, and lead wires 3 and 3 tightly connected to an internal terminal at an end bracket 1b of the other end of the motor body 1 by solder 1c.

When mounting such an eccentric ring type vibration motor on the printed circuit board built into a portable telephone set etc., usually use is made of, for example, a metal holder frame 5 as shown in FIG. 7. This metal holder frame 5 is provided with a rectangular bottom plate portion 6 which contacts the surface of the printed circuit board, a pair of curved spring holding pieces 7 and 7 which are bent upward from the left and right long sides, receive a substantially tubular drum portion of the vibration motor body 1, and grip the same, and engagement pieces 8 and 8 which are bent downward from the short side ends of the bottom plate portion 6 and are inserted into penetration type engagement holes of the printed circuit board.

In mounting the vibration motor to the board, first the substantially tubular drum portion of the vibration motor body 1 is fitted into the accommodation portion 9 between the curved spring holding pieces 7 and 7 to fix it in place, then the engagement pieces 8 and 8 of the metal holder frame 5 are inserted into the penetration engagement holes of the printed circuit board and the engagement pieces 8 and 8 are affixed at the rear side of the board. Then, the front ends of the lead wires 3 and 3 are affixed to the terminal pattern of the board by soldering.

In a vibration motor, however, there are the following problems.

<1> In order to facilitate the work of mounting on the board, it has been studied to eliminate the engagement pieces 8 and 8 of the metal holder frame 5 and the penetration engagement holes of the board and mount the parts of the vibration motor on the surface in the same way as the principal electronic components all together are mounted by reflow soldering. When adhering the bottom plate portion 6 of the metal holder frame 5 accommodating the vibration motor body to the reverse surface pattern of the printed circuit board by coating a cream solder, adhering the principal electronic components to the front surface pattern of the printed circuit board by coating a cream solder, and reflowing the solder on the printed circuit board in such a state in a heating furnace with the principal electronic components facing up to affix them, since the vibration motor is a heavy part which, even though small in size (for example, having a diameter of 7 mm and a length of 2 cm), is provided with an eccentric ring 2 having a high specific gravity, such as tungsten, only the lower side metal holder frame 5 accommodating the vibration motor body ends up detaching from printed circuit board. Of course, if the heating is carried out in a state with the metal holder frame 5 at the top side, its detachment can be prevented, but the principal electronic components themselves require stricter mounting precision, therefore there is the danger of slight floating or deviation occurring at the connection positions if the principal electronic components are faced downward. Accordingly, the metal holder frame 5 accommodating the vibration motor body must be positioned faced downward during the heating.

For this reason, the metal holder frame 5 is still provided with the engagement pieces 8 and 8 for attachment to the printed circuit board, so an additional step of attaching only the metal holder frame 5 accommodating the vibration motor body to the printed circuit board is necessary. This makes the process of mounting on the board more troublesome and causes an increase of the manufacturing cost.

<2> There is a method in which adhering only the metal holder frame 5 to the reverse surface pattern of the printed circuit board by coating a cream holder and affixing it in a heating furnace, then inserting the vibration motor body into this affixed metal holder frame 5 to fix it in place. However, the additional step of mounting only the vibration motor body is necessary. In the same way as that described above, it makes the process of mounting on the board more troublesome and causes an increase of the manufacturing cost.

<3> Further, although the mounted vibration motor is relatively strongly gripped by the curved spring holding pieces 7 and 7 of the metal holder frame 5 affixed to the printed circuit board, when the vibration motor is being started up, a relatively slight deviation is apt to occur with the spring holding pieces 7 and 7 due to the added vibration shock which it generates by itself. For this reason, when the vibration motor is repeatedly activated many times during long years of use, the slight deviation gradually accumulates and results in a situation where the vibration motor turns from its fixed position, therefore easily causes abnormalities in vibration and poor lead connection due to the tensile stress applied to the lead wires 3 and 3.

SUMMARY OF THE INVENTION

Therefore, in consideration of the above problems, the object of the present invention is to provide a vibration motor which has a structure that can be simultaneously mounted in the double-side mounting process of mounting on a printed circuit board by reflow soldering and can prevent rotational deviation between the vibration motor body and the metal holder frame.

In order to achieve the above object, the present invention provides a vibration motor comprising: a metal holder frame provided with a motor accommodation portion for receiving and holding a substantially tubular drum portion of a vibration motor body, and terminal pieces for being affixed and connected to end portions of the vibration motor body, wherein the metal holder frame has a bottom plate portion for soldering to a pattern on a printed circuit board and has a bulge portion formed by making a depression in the rear side of the bulge portion to make a projection on the front side of the bulge portion at least at one position of the bottom plate portion.

In the double-side mounting process using reflow soldering to the printed circuit board, the bottom plate portion of the metal holder frame is adhered to the pattern on the printed circuit board by coating a cream solder and affixed by causing the solder to reflow on the printed circuit board in this state in a heating furnace with the metal holder frame facing downward, but since the reverse side of at least one bulge portion of the bottom surface is depressed, the melted solder fills the depression and the adhesion force is strengthened by the surface tension in the heating furnace, therefore it is hard for the metal holder frame to detach from the printed circuit board. Further, when driving the motor, the top of the bulge portion functions to prevent the vibration motor body from turning in the accommodation portion, therefore the vibration motor body resists turning from its fixed position and thus abnormalities in vibration and failure of terminal connection can be prevented.

Here, the bulge portion is preferably formed at substantially the position of the center of gravity. Detachment becomes further difficult since the surface tension acting upon the bulge portion is balanced.

Further, the bulge portion is preferably equipped with a notch. Since a notch penetrating from the front to rear sides is formed in the bulge portion, the surface tension is further strengthened at the thick part thereof and detachment becomes further difficult in the heating furnace. In addition, the solder easily fuses together on the bottom plate via the notch to form a penetrating connecting structure, therefore the fixing force after solidification becomes further stronger.

Further, when the depression of the bulge portion is provided with a spot weld for affixing the bottom surface of the substantially tubular drum portion, not only is rotational deviation prevented, but also the holding force of the vibration motor body rises, therefore it is possible to reduce the weight of the metal holder frame by simplifying the structure of the motor accommodation portion itself and prevent detachment during the reflow soldering.

Further, the bottom plate portion preferably is comprised having a contour edge having repeated inlet shaped notches. As these inlet shaped notches, various shapes can be adopted. The substantial length of the contour is considerably extended by the contour edge having the repeated inlet shaped notches, therefore the surface tension of the melted solder can be conspicuously strengthened and the detachment in the heating furnace can be substantially eliminated.

The adhesion force (hanging force) of the melted solder acts more strongly at the thick position of the end edge than the flat surface, therefore it is more effective to increase the length of the end edge than to increase the bottom area of the bottom plate portion. If the bottom area is increased, the space efficiency deteriorates and the weight ends up increasing, therefore that is not preferred.

Further, the bottom plate portion preferably has a punched hole. Along with the reduction of weight of the metal holder frame, the surface tension at an inner circumferential edge of the punched hole is effective for preventing detachment in the heating furnace. In addition, adjustment of the center of gravity becomes possible, therefore parallelness between the pattern surface of the printed circuit board and the bottom plate portion can be easily obtained.

When the reverse surface of the bottom plate portion is made a rough surface by pebbling etc., since there are more points of action of the surface tension in comparison with a smooth surface, not only this is effective for the prevention of detachment in the heating furnace, but it is also possible to equalize the positions of affixment with the pattern surface of the printed circuit board and the strength of the attachment is improved.

When the terminal piece has a bent lower end portion for soldering to the terminal pattern on the printed circuit board, the surface tension of the melted solder is increased by that amount, therefore this is useful for the prevention of detachment.

In addition to this, preferably the bent lower end portion of the terminal piece is oriented not facing outward, but facing inward toward the bottom surface portion. The area occupied by the entire vibration motor on the printed circuit board can therefore be reduced.

BRIEF DESCRIPTION OF THE DRAWINGS

The above object and features of the present invention will be more apparent from the following description of the preferred embodiments when read in conjunction with the accompanying drawings, wherein:

FIG. 1A is a front view of a vibration motor according to a first embodiment of the present invention; FIG. 1B is a right side view thereof; FIG. 1C is a left side view thereof; and FIG. 1D is a bottom view thereof;

FIG. 3A is a front view of a metal holder frame of the vibration motor shown in FIGS. 1A–1D; FIG. 3B is a right side view thereof; FIG. 3C is a left side view thereof; FIG. 3D is a bottom view thereof; and FIG. 3E is a sectional view of a cut-away state along a line A—A' in FIG. 3D;

FIG. 5A is a front view of the metal holder frame of the vibration motor shown in FIGS. 4A–4D; FIG. 5B is a right side view thereof; FIG. 5C is a left side view thereof; and FIG. 5D is a bottom view thereof;

FIG. 6A is a bottom view of an example of a conventional vibration motor body.

DESCRIPTION OF THE PREFERRED EMBODIMENTS

Next, embodiments of the present invention will be described with reference to the accompanying drawings.

Embodiment 1

FIG. 1A is a front view of a vibration motor according to a first embodiment of the present invention; FIG. 1B is a right side view thereof; FIG. 1C is a left side view thereof; and FIG. 1D is a bottom view thereof.

Figure 2B:
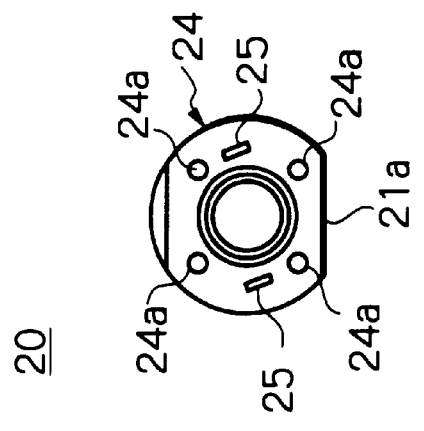
FIG. 2B is a right side view thereof.
Figure 2A:
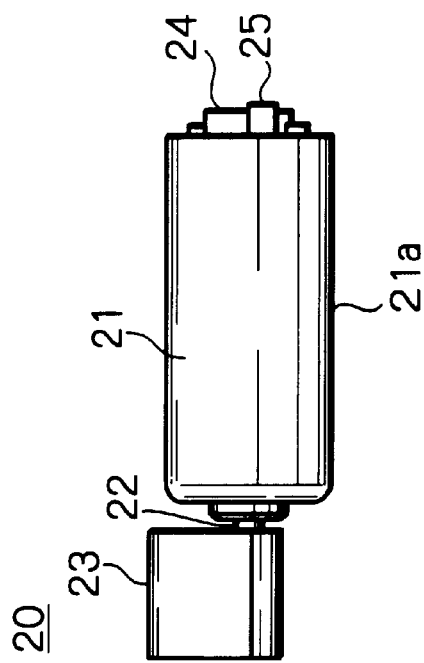
FIG. 2A is a front view of a vibration motor body of the vibration motor shown in FIGS. 1A–1D.
Figure 2C:
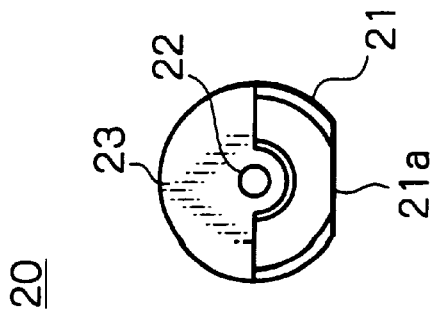
FIG. 2C is a left side view thereof.

Further, FIG. 2A is a front view of a vibration motor body of the vibration motor shown in FIGS. 1A–1D; FIG. 2B is a right side view thereof; and FIG. 2C is a left side view thereof.

Further, FIG. 3A is a front view of a metal holder frame of the vibration motor shown in FIGS. 1A–1D; FIG. 3B is a right side view thereof; FIG. 3C is a left side view thereof; FIG. 3D is a bottom view thereof; and FIG. 3E is a sectional view of a cut-away state along a line A—A in FIG. 3D.

Referring to these figures, a vibration motor 10 of the present example has a vibration motor body 20, a metal holder frame 30 provided with a motor accommodation portion 31 for receiving and holding a substantially tubular drum portion 21, and terminal pieces 40 and 40 affixed to end portions of the vibration motor body 20. The substantially tubular drum portion 21 has a flat bottom surface 21a aligned in a generatrix direction.

The vibration motor body 20 of the present example is a motor equipped with a brush and has the substantially tubular drum portion 21 and a substantially half moon-like conical eccentric ring 23 affixed to a motor shaft 22 projected from one end thereof. The other end surface of the substantially tubular drum portion 21 is closed by an end bracket 24 made of plastic. Positioning dowels 24a fitted in dowel holes of terminal pieces 40 and 40 are formed so as to project from this end bracket 24. Further, through holes for allowing brush terminal pieces 25 and 25 to project to the outside are formed. Outside terminal pieces 40 and 40 are fit into and soldered with the projected brush terminal pieces 25 and 25.

The metal holder frame 30 has a rectangular bottom plate portion 32 which contacts the pattern of the surface of a printed circuit board illustrated in phantom at 100 in FIG. 1A a pair of curved holding spring pieces 33 and 33 which are bent upward from the left and right long sides, receive a substantially tubular drum portion 21 of the vibration motor body 20, and grip the same, and pressing pieces 34 and 34 which are bent inward from the front ends of the holding spring pieces 33 and 33 and contact the end surfaces of the substantially tubular drum portion 21. In order to facilitate the reception and fitting of the substantially tubular drum portion 21 into the motor accommodation portion 31, the free edges of the curved holding spring pieces 33 and 33 are flared outward. On the terminal piece 40 and 40 side in the bottom plate portion 32, notches 35 and 35 are formed so as not to interfere with the bent lower end portions 41 and 41 having the inward orientation. A bottom narrow portion 36 extends between these notches 35 and 35. The end thereof stands upward and serves as a pressing piece 37 contacting with the end surface of the substantially tubular drum portion 23.

In this example, as shown in FIG. 3E, the bulge portion 38 formed by making a depression in the rear side 38r of the bulge portion 38 to make a projection on the front side 38f of the bulge portion 38 is formed at substantially the center of the bottom plate portion 32. This bulge portion 38 is equipped with notches which are shaped to produce a rectangular platform and has notches (slits) 38a parallel to the long sides of the bottom plate portion 32 on its two sides. The bulge portion 38 of the present example is formed at the position of the center of gravity of the vibration motor assembly in a state accommodating the vibration motor 20 and is located at a position slightly closer to the eccentric ring 23 side than the center of the bottom plate portion 32. Further, the share of the area of the bottom plate portion 32 occupied by the bulge portion 38 becomes about ⅙ or more.

In the double-side mounting process by reflow soldering to the printed circuit board, the bottom plate portion 32 of the metal holder frame 30 accommodating the vibration motor 20 is adhered to the pattern on the printed circuit board by coating a cream solder, and the bent lower end portions 41 and 41 of the terminal pieces 40 are adhered to the terminal pattern on the printed circuit board by coating a cream solder. Other principal electronic compounds are similarly adhered to predetermined patterns by coating a cream solder. These are affixed to the printed circuit board by reflowing the solder in a heating furnace with the principal electronic components facing upward.

Here, the cream solder is also coated in the depression of the rear side 38r of the bulge portion 38 of the bottom surface portion 32, therefore melted solder in the depression in the heating furnace and the adhesion force due to the surface tension is strengthened and thus the metal holder frame 30 becomes resistant to detachment from the printed circuit board.

Particularly, the bulge portion 38 is formed at substantially the position of the center of gravity, therefore the surface tension acting upon the bulge portion 38 is balanced and thus the detachment becomes further difficult. Note that when placed in the heating furnace, desirably the eccentric ring 23 is stopped at a horizontally symmetrical position as shown in FIG. 1C. This is to secure a balance between the left and right.

When the automatic mounting apparatus for mounting parts on the printed circuit board is an apparatus for mounting them only on one surface of the printed circuit board, the reflow soldering is applied by dividing the process into two. Namely, parts are mounted only on one surface and affixed by solder in the heating furnace, then parts are mounted on the other surface of the printed circuit board and affixed by solder in the heating furnace. In such a case as well, the metal holder frame 30 becomes resistant to detachment from the printed circuit board.

Further, when driving the vibration motor after mounting, the top of the bulge portion 38 functions to stop turning by receiving the flat bottom surface 21a of the vibration motor body 20 abutting against it when the vibration motor body 20 is pressed by the spring grasping spring pieces 33 and 33, therefore the vibration motor body 20 resists turning from its fixed position and thus abnormallities of vibration and failures of terminal connection can be prevented.

The bulge portion 38 of the present example is equipped with notches. The top edge of the bulge portion 38 forms a sharp angle due to the cutting of the notches (slits) 38a. Therefore, the turn stopping function is strong. Also, the surface tension is further strengthened at that thick part, therefore detachment becomes further difficult in the heating furnace. In addition, the solder easily fuses together on the bottom plate via the notch 38a to form a penetrating connecting structure, therefore the fixing force after solidification becomes further stronger.

The terminal pieces 40 and 40 affixed to the end portions of the substantially tubular drum portion 23 of the present example have bent lower end portions 41 and 41 for soldering to the terminal pattern on the printed circuit board. Accordingly, the pattern is adhered to these bent lower end portions 41 and 41 as well by coating the cream solder, therefore the surface tension of the melted solder is increased by that—which is useful for the prevention of detachment.

Embodiment 2

Figure 4B:
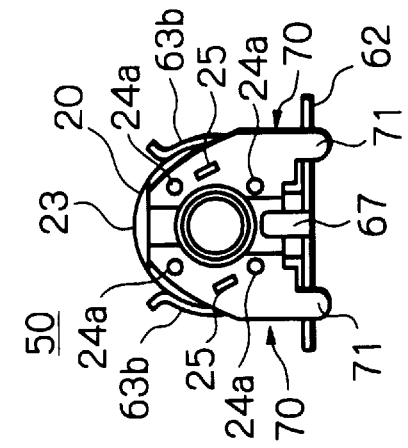
FIG. 4B is a right side view thereof.
Figure 4A:
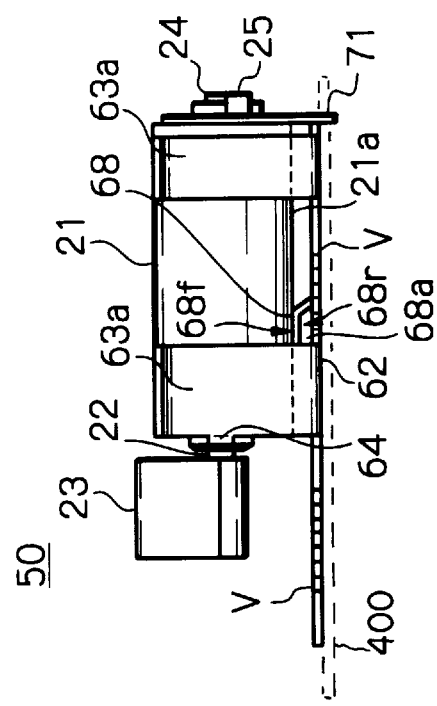
FIG. 4A is a front view of a vibration motor according to a second embodiment of the present invention.
Figure 4C:
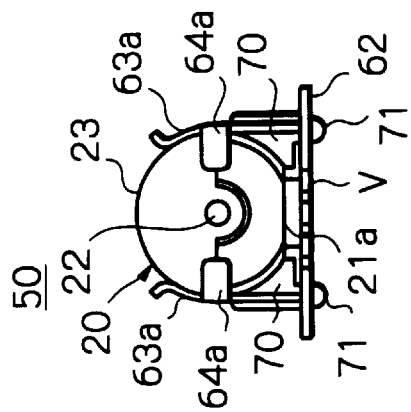
FIG. 4C is a left side view thereof.
Figure 4D:
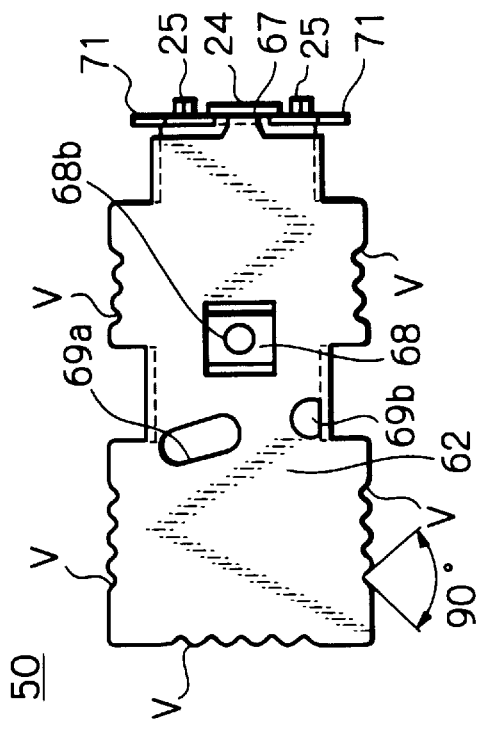
FIG. 4D is a bottom view thereof.
Figure 7:
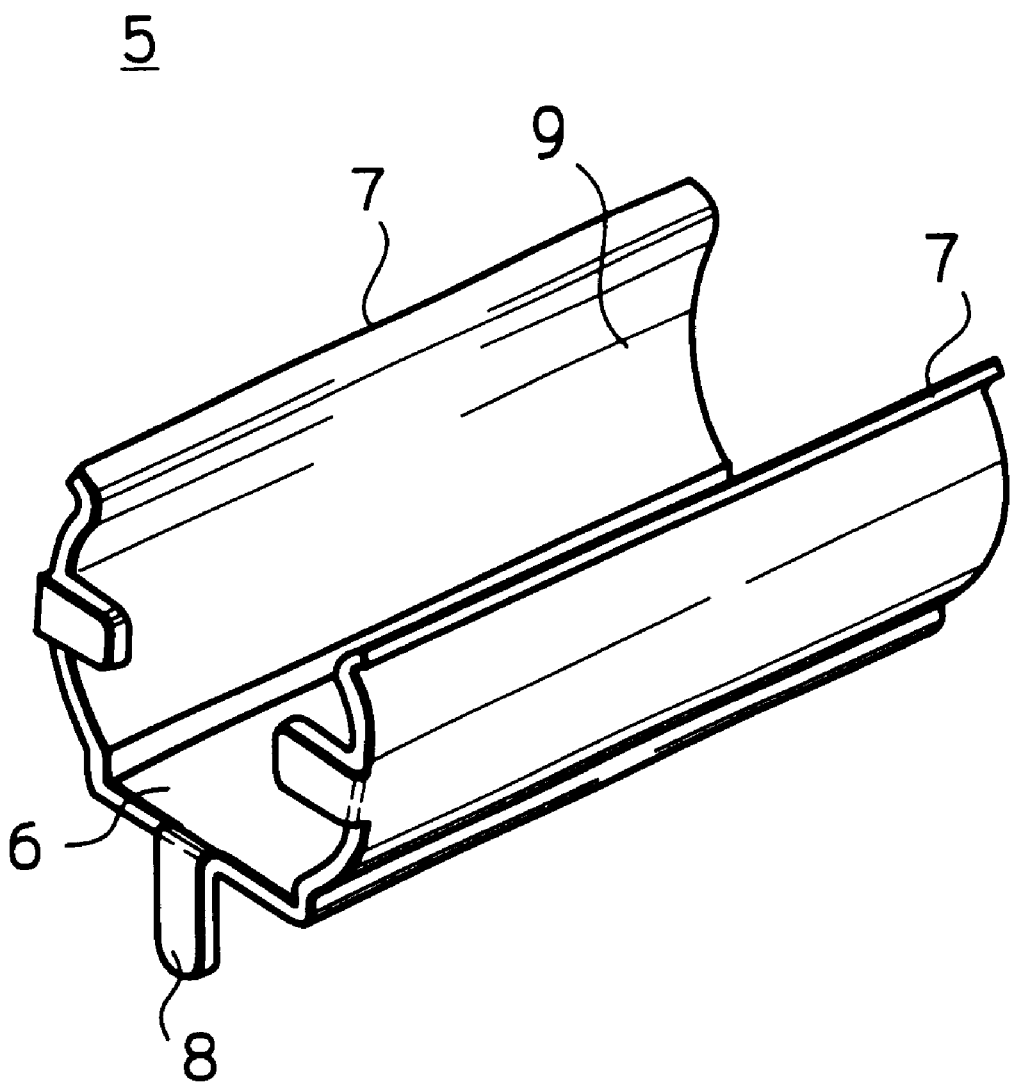
FIG. 7 is a perspective view of the metal holder frame used when mounting the vibration motor body shown in FIG. 6 on a printed circuit board.

FIG. 4A is a front view of a vibration motor according to a second embodiment of the present invention; FIG. 4B is a right side view thereof; FIG. 4C is a left side view thereof; and FIG. 4D is a bottom view thereof.

Also, FIG. 5A is a front view of the metal holder frame of the vibration motor shown in FIGS. 4A–4D; FIG. 5B is a right side view thereof; FIG. 5C is a left side view thereof; and FIG. 5D is a bottom view thereof. Note that, in FIGS. 4A–4D, the same parts as those shown in FIGS. 1A–1D are given the same reference symbols, and explanations thereof will be omitted.

The vibration motor 50 of the present example has the vibration motor body 20 shown in FIGS. 2A–2C, a metal holder frame 60 provided with a motor accommodation portion 61 for receiving the substantially tubular drum portion 21 thereof and gripping the same, and terminal pieces 70 and 70 affixed to end portions of the vibration motor body 20.

The terminal pieces 70 and 70 of the present example have straight insertion legs 71 and 71 which are inserted into land holes of the printed circuit board shown in phantom at 400 in FIG. 4A.

The metal holder frame 60 has a substantially rectangular bottom plate portion 62 which contacts the pattern of the surface of the printed circuit board, two pairs of curved holding spring pieces 63*a* and 63*a* (63*b*, 63*b*) which are bent upward from the left and right long sides, receive the substantially tubular drum portion 21 of the vibration motor body 20, and grip the same, and pressing pieces 64*a* and 64*a* which are bent inward from the front ends of the holding spring pieces 63*a* and 63*a* and contact the end surfaces of the substantially tubular drum portion 21. In order to facilitate the reception and fitting of the substantially tubular drum portion 21 into the motor accommodation portion 61, the front edges of the curved holding spring pieces 63*a* and 63*a* (63*b*, 63*b*) are flared outward. The side ends of the terminal pieces 70 and 70 in the bottom plate portion 32 stand upward and serve as pressing pieces 67 contacting the end surfaces of the substantially tubular drum portion 21.

In the present example as well, as shown in FIG. 5A, the bulge portion 68 formed by making a depression in the rear side 68*r* of the bulge portion 68 to make a projection on the front side 68*f* is formed at substantially the center of the bottom plate portion 62. This bulge portion 68 is a bulge portion equipped with notches which is shaped at a rectangular base and has at the two sides notches 68*a* parallel to the long sides of the bottom plate portion 62. Particularly, in the present example, a spot weld 68*b* for affixing the bottom surface 21*a* of the substantially tubular drum portion 21 is formed in the depression of the bulge portion 68. This spot weld 68*b* is formed by the electric welding (projection spot) method or a laser welding (laser spot) method.

Further, an oval punched hole 69*a* is formed at the center part of the bottom plate portion 62. At the same time, a circular notch-like punched hole 69*b* is formed at the edge of the bottom plate portion 62. Further, the bottom plate portion 62 of the present example projects forward from the eccentric ring 23. The front edge side thereof and the part of the two side edges other than the rising base portions of the holding spring pieces 63*a* and 63*a* (63*b*, 63*b*) have a zigzag-like contour shape in which an inlet-like notch V is repeatedly formed. In the present example, the notch angle of this inlet-like notch V is 90°.

In the double-side mounting process by reflow soldering to the printed circuit board, the bottom plate portion 62 of the metal holder frame 60 accommodating the vibration motor 20 is adhered to the pattern on the printed circuit board by coating a cream solder. At the same time, cream solder is coated on the insertion legs 71 and 71 of the terminal pieces 70 which are inserted into land holes of the printed circuit board. Other principal electronic parts are similarly adhered to predetermined patterns by coating cream solder. These are affixed to the printed circuit board by reflowing the solder in a heating furnace with the principal electronic parts facing upward.

Here, the cream solder is also coated in the depression of the rear side 68*r* of the bulge portion 68 of the bottom surface portion 62, therefore melted solder is filled in the depression in the heating furnace and the adhesion force due to the surface tension is strengthened and thus the metal holder frame 60 becomes resistant to detachment from the printed circuit board. Further, when using the vibration motor after mounting, the top of the bulge portion 68 functions to stop turning by receiving the flat bottom surface 21*a* of the vibration motor body 20 abutting against this since the vibration motor body 20 is pressed against by the two pairs of holding spring pieces 63*a* and 63*a* (63*b*, 63*b*), therefore the vibration motor body 20 is resistant to turning from its fixed position and thus abnormalities of vibration and failure of terminal connections can be prevented.

When the automatic mounting apparatus for mounting parts on the printed circuit board is an apparatus for mounting them only on one surface of the printed circuit board, the reflow soldering is applied by dividing the process into two. Namely, parts are mounted only on one surface and affixed by solder in the heating furnace, then parts are mounted on the other surface of the printed circuit board and affixed by solder in the heating furnace. In such a case as well, the metal holder frame 60 becomes resistant to detachment from the printed circuit board.

The bulge portion 68 of the present example also is a bulge portion equipped with notches. The top edge of the bulge portion 68 forms a sharp angle due to the cutting of the notches (slits) 68*a*.

Therefore, the turn stopping function is strong. Also, the surface tension is further strengthened at the thick part, therefore detachment becomes further difficult in the heating furnace. In addition, the solder easily fuses together on the bottom plate via the notch 68*a* to form a penetrating connecting structure, therefore the fixing force after solidification becomes further stronger.

The point of difference from the first embodiment resides in that the bottom plate portion 62 has a contour edge having repeated inlet shaped notches V, therefore the actual contour length is considerably extended and thus the surface tension of the melted solder can be conspicuously strengthened. For this reason, detachment in the heating furnace can be substantially eliminated. Particularly, the bottom plate portion 62 of the present example projects out to the eccentric ring 23 side in comparison with the first embodiment and is made to correspond to the substantial occupied area of the vibration motor body 20, therefore the surface tension of the melted solder can be conspicuously strengthened due to the increase of the length of the contour.

Further, punched holes 69*a* and 69*b* are formed in the bottom surface portion 62. Along with the reduction of weight of the metal holder frame 60, the surface tension at the inner circumferential edge of the punched holes 69*a* and 69*b* is effective for the prevention of detachment in the heating furnace. Adjustment of the center of gravity becomes possible by these punched holes 69*a* and 69*b*. Parallelness between the pattern surface of the printed circuit board and the bottom plate portion 62 can be easily obtained. Further, in contrast to the fact that the holding spring pieces 33 and 33 of the first embodiment are formed by one left and right plate, in the present example, a gap is formed between two pairs of spring pieces 63*a* and 63*a* (63*b*, 63*b*) to try to reduce the weight by that amount. It is therefore possible to cancel out the weight of the projected area of the bottom plate portion 62.

Particularly, in the present example, since the depression of the bulge portion 68 is provided with the spot weld 68*b* for affixing the bottom surface 21*a* of the substantially tubular drum portion 21, not only is there no rotational deviation at all, but also the holding force of the vibration motor body 20 rises even in the simple motor accommodation portion 61 using two pairs of spring pieces 63*a* and 63*a* (63*b*, 63*b*) having narrow width, therefore, the reduction of weight of the metal holder frame 60 can be realized and detachment at the reflow soldering can be prevented.

In addition, this spot weld 68*b* is located in the vicinity of the position of the center of gravity, therefore is resistant to the added vibration shock of the vibration motor body 20 and is resistant to stress breakage.

Note that, it is also possible to form the reverse surface of the bottom plate portion of the first end second embodiments as a rough surface by pebbling or the like. Since there are more points of action of the surface tension in comparison with a smooth surface, not only this is effective for the prevention of detachment in the heating furnace, but it is also possible to equalize the positions of affixment with the pattern surface of the printed circuit board and the strength of the attachment is improved.

As explained above, the vibration motor according to the present invention is characterized in that a bulge portion formed by making a depression in the rear side to make a projection on the front side is formed at least at one position of the bottom portion of the metal holder frame. The depression of this bulge portion functions as a receiver of the melted solder. At the same time, the top side of the bulge portion functions as a turn stopping means, therefore exhibits the following effects.

<1> The rear side of at least one bulge portion of the bottom surface portion is depressed, therefore the melted solder is filled in the depression in the heating furnace and the adhesion force due to the surface tension is strengthened, thus the metal holder frame is resistant to detachment from the printed circuit board. For this reason, simultaneously with the usual electronic parts, the motor can be mounted on the board by reflow soldering and the cost of mounting can be lowered.

Further, when driving the motor, the bulge portion stops the turning of the vibration motor body, therefore the vibration motor body resists turning from its fixed position and it is possible to prevent abnormalities in the vibration and failure of the terminal connection.

<2> When the bulge portion is formed at substantially the position of the center of gravity, the surface tension acting upon the bulge portion is balanced, therefore detachment becomes further difficult.

<3> When the bulge portion is a bulge portion equipped with notches, since notches are formed penetrating from front to rear, the surface tension is further strengthened at that thick part, therefore detachment becomes further difficult in the heating furnace. In addition, the solder easily fuses together on the bottom plate via the notch to form a penetrating connecting structure, therefore the fixing force after solidification becomes further stronger.

<4> When the depression of the bulge portion is provided with a spot weld for affixing the bottom surface of the substantially tubular drum portion, not only is there no rotational deviation, but also the holding force of the vibration motor body rises, therefore a reduction of weight of the metal holder frame can be realized by the simplification of the structure of the motor accommodation portion per se and detachment at the reflow soldering can be prevented.

<5> When the bottom plate portion has a contour edge having repeated inlet shaped notches, the length of the contour is considerably extended by the contour edge having repeated inlets, therefore the surface tension of the melted solder can be conspicuously strengthened and detachment in the heating furnace can be substantially eliminated.

<6> Where the bottom plate portion has punched holes, along with a reduction of weight of the metal holder frame, the surface tension at the inner circumferential edge of the punched hole is effective for the prevention of detachment in the heating furnace. In addition, adjustment of the center of gravity becomes possible, therefore parallelness between the pattern surface of the printed circuit board and the bottom plate portion can be easily obtained.

<6> When the back surface of the bottom plate portion is a rough surface, since there are more points of action of the surface tension in comparison with a smooth surface, not only this is effective for the prevention of detachment in the heating furnace, but it is also possible to equalize the positions of affixment with the pattern surface of the printed circuit board and the strength of the attachment is improved.

<8> When the terminal piece has a bent lower end portion for soldering to the terminal pattern on the printed circuit board, the surface tension of the melted solder is increased by that amount, therefore this is useful for the prevention of detachment.

<9> When the bent lower end portion of the terminal piece is oriented facing inward toward the bottom surface portion, the area occupied by the entire vibration motor on the printed circuit board can be reduced.

What is claimed is:

1. A vibration motor comprising:
    a metal holder frame provided with a motor accommodation portion for receiving and holding a substantially tubular drum portion of a vibration motor body; and
    terminal pieces for being affixed and connected to end portions of the vibration motor body;
    the metal holder frame having:
        a bottom plate portion for soldering to a reverse surface pattern a printed circuit board, said reverse surface pattern being opposite to a front surface pattern of said printed circuit board on which principal electronic parts are to be mounted by soldering; and
        a bulge portion formed by making a depression in the rear side of the bulge portion to make a projection on the front side of the bulge portion at least at one position of the bottom plate portion;
    said depression in said rear side of the bulge portion being formed in such a way that, during a double-side mounting process of mounting on the printed circuit board, melted solder fills the depression and adhesion force is strengthened by the surface tension.

2. A vibration motor as set forth in claim 1, wherein the bulge portion is formed at substantially the position of the center of gravity of said vibration motor assembly.

3. A vibration motor as set forth in claim 1 or 2, wherein the bulge portion is provided with a notch.

4. A vibration motor as set forth in claim 1, wherein the vibration motor body contains a substantially tubular drum portion and the depression of the bulge portion is provided with a spot weld affixing the bottom surface of the substantially tubular drum portion to the bulge portion.

5. A vibration motor as set forth in claim 1, wherein the bottom plate portion of said metal holder frame has a contour edge having repeated inlet shaped notches.

6. A vibration motor as set forth in claim 1, wherein the bottom plate portion of said metal holder frame has a punched out hole.

7. A vibration motor as set forth in claim 1, wherein a reverse surface of the bottom plate portion engaging the vibration motor body is rough.

8. A vibration motor as set forth in claim 1, wherein the terminal pieces have bent lower end portions for soldering to the terminal pattern on the printed circuit board.

9. A vibration motor as set forth in claim 8, wherein the bent lower end portions of the terminal pieces are oriented facing inward toward the bottom surface portion.

* * * * *